(12) United States Patent
Jung

(10) Patent No.: US 7,504,661 B2
(45) Date of Patent: Mar. 17, 2009

(54) THIN FILM TRANSISTOR SUBSTRATE AND FABRICATING METHOD THEREOF

(75) Inventor: Tae Yong Jung, Gumi-si (KR)

(73) Assignee: LG. Display Co., Ltd., Seoul (KR)

( * ) Notice: Subject to any disclaimer, the term of this patent is extended or adjusted under 35 U.S.C. 154(b) by 243 days.

(21) Appl. No.: 11/320,510

(22) Filed: Dec. 28, 2005

(65) Prior Publication Data

US 2007/0001170 A1    Jan. 4, 2007

(30) Foreign Application Priority Data

Jun. 30, 2005    (KR) ...................... 10-2005-0058058

(51) Int. Cl.
*H01L 29/04* (2006.01)
*G02F 1/136* (2006.01)

(52) U.S. Cl. ................... 257/59; 257/72; 257/E21.599; 349/40; 349/43; 349/44; 349/106; 349/147

(58) Field of Classification Search ................... 257/59, 257/72, E21.599; 349/44, 106, 110, 147 349/43, 40
See application file for complete search history.

(56) References Cited

U.S. PATENT DOCUMENTS

| 5,055,899 A | * | 10/1991 | Wakai et al. | ................... 257/61 |
| 6,476,415 B1 | * | 11/2002 | Walker et al. | ................... 257/59 |
| 2004/0109101 A1 | * | 6/2004 | Kim et al. | ...................... 349/44 |
| 2005/0077517 A1 | * | 4/2005 | Chang et al. | ................... 257/59 |
| 2005/0077524 A1 | * | 4/2005 | Ahn et al. | ...................... 257/72 |
| 2005/0078233 A1 | * | 4/2005 | Lim et al. | ...................... 349/43 |
| 2005/0078246 A1 | * | 4/2005 | Yoo et al. | ................... 349/122 |
| 2005/0078259 A1 | * | 4/2005 | Ahn et al. | ................... 349/141 |
| 2005/0078264 A1 | * | 4/2005 | Yoo et al. | ................... 349/152 |
| 2006/0138417 A1 | * | 6/2006 | Ahn et al. | ...................... 257/59 |
| 2006/0139504 A1 | * | 6/2006 | Ahn et al. | ...................... 349/42 |

* cited by examiner

*Primary Examiner*—Long K Tran
(74) *Attorney, Agent, or Firm*—Brinks Hofer Gilson & Lione

(57) ABSTRACT

A thin film transistor substrate and method of fabrication is presented. The thin film transistor includes gate and data lines forming a pixel area and separated by a gate insulating layer on a LCD substrate. A thin film transistor in the pixel area has a semiconductor pattern which forms a channel. A pixel electrode in the pixel area contains a transparent conductive film. A gate metal film is adjacent to a portion of transparent conductive film in the pixel area. A semiconductor passivation film is formed by exposing the semiconductor in the channel to an oxygen or nitrogen plasma. A gate pad connected with the gate line contains the transparent film in a pad section and the transparent film and the gate film in a connection area connecting the gate pad and the gate line. A data pad connected with the data line contains the transparent film.

18 Claims, 17 Drawing Sheets

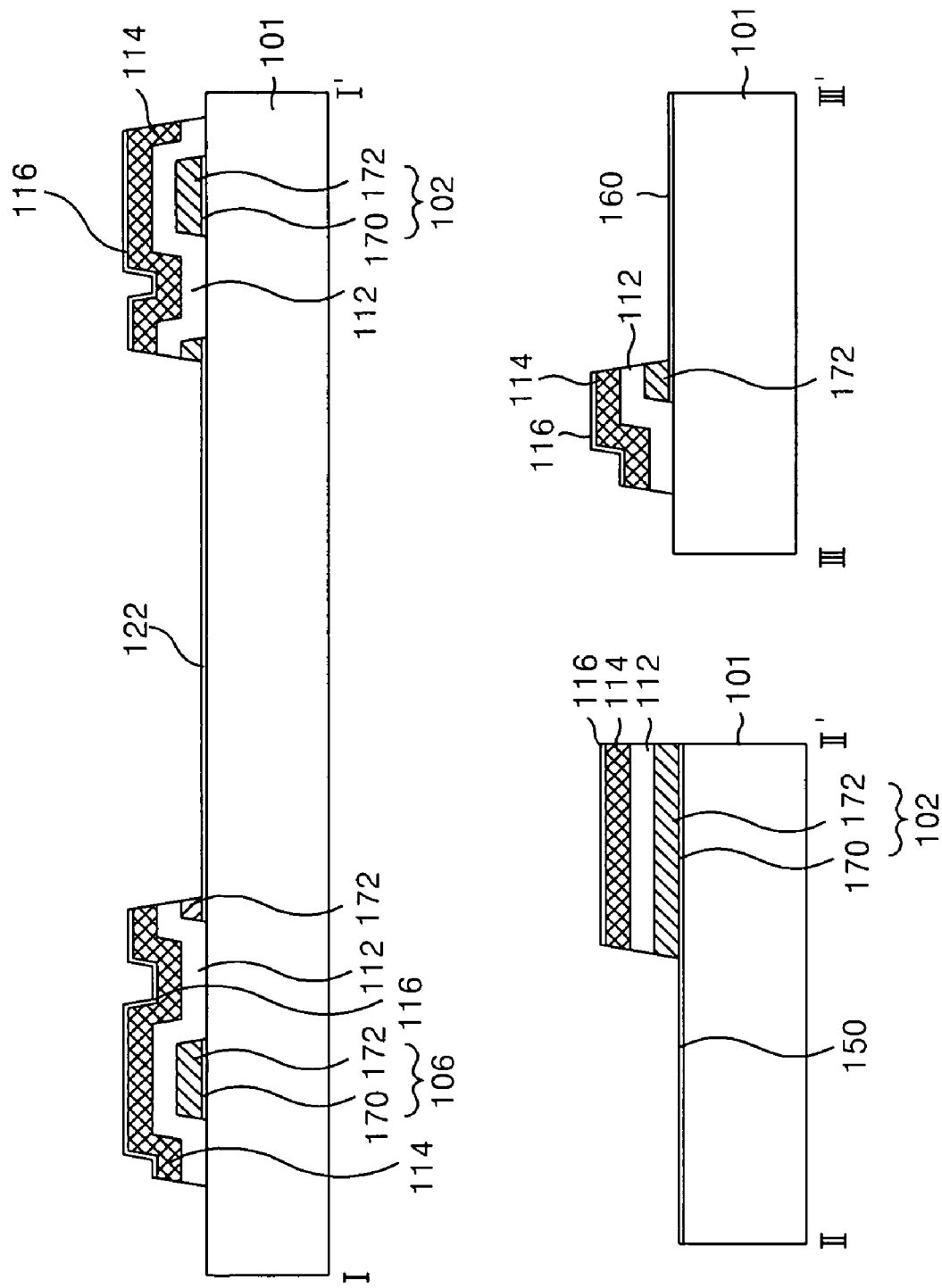

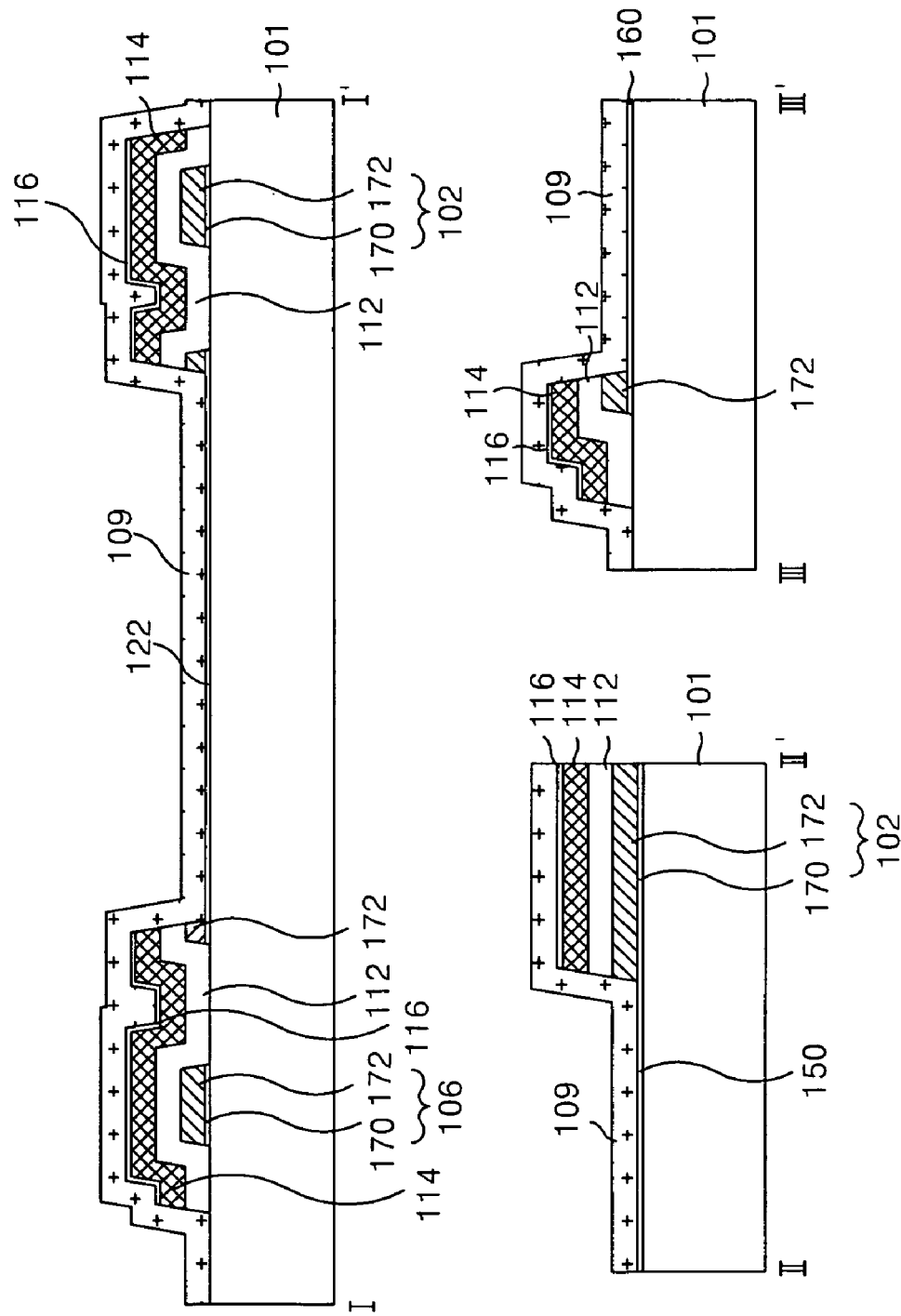

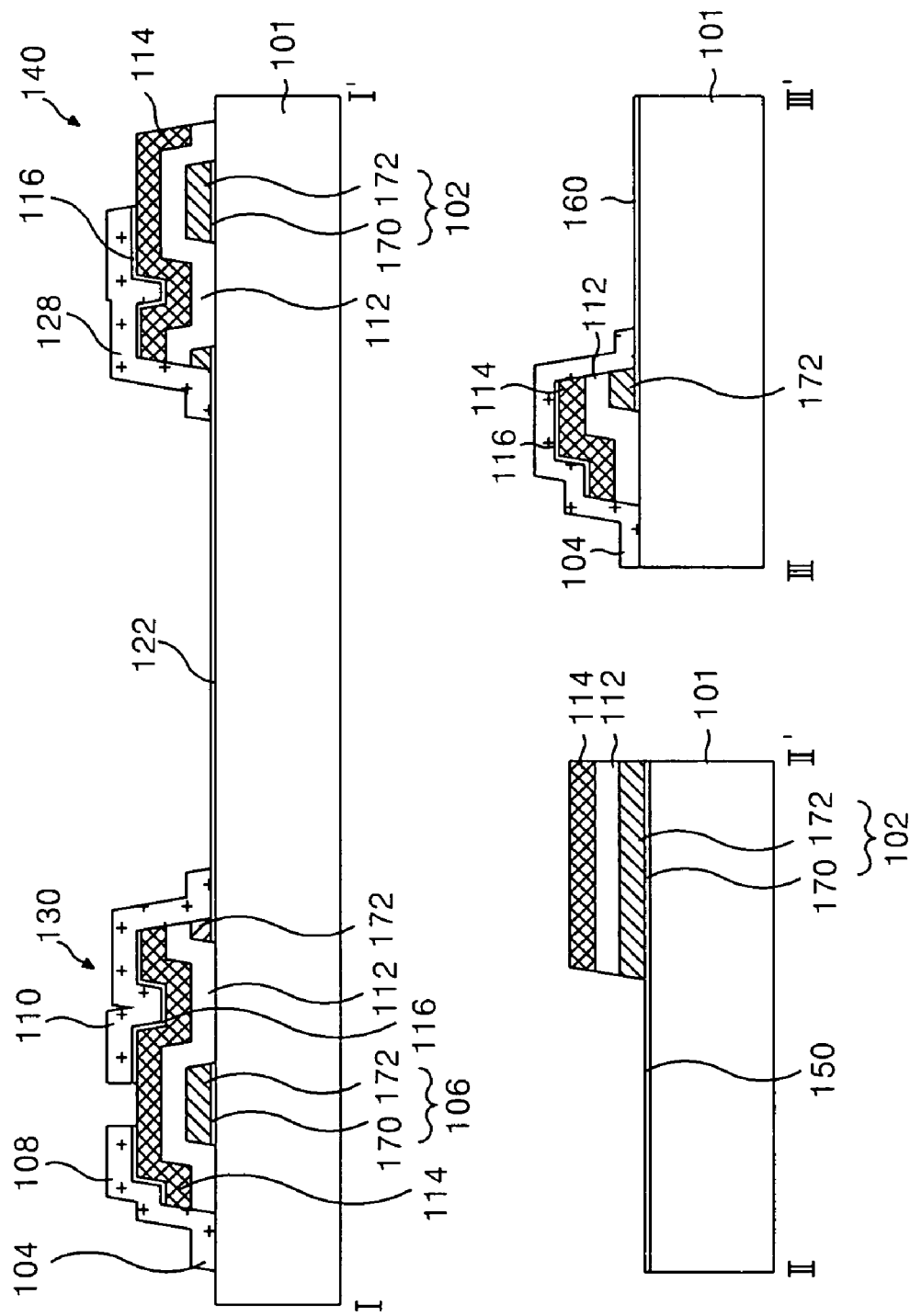

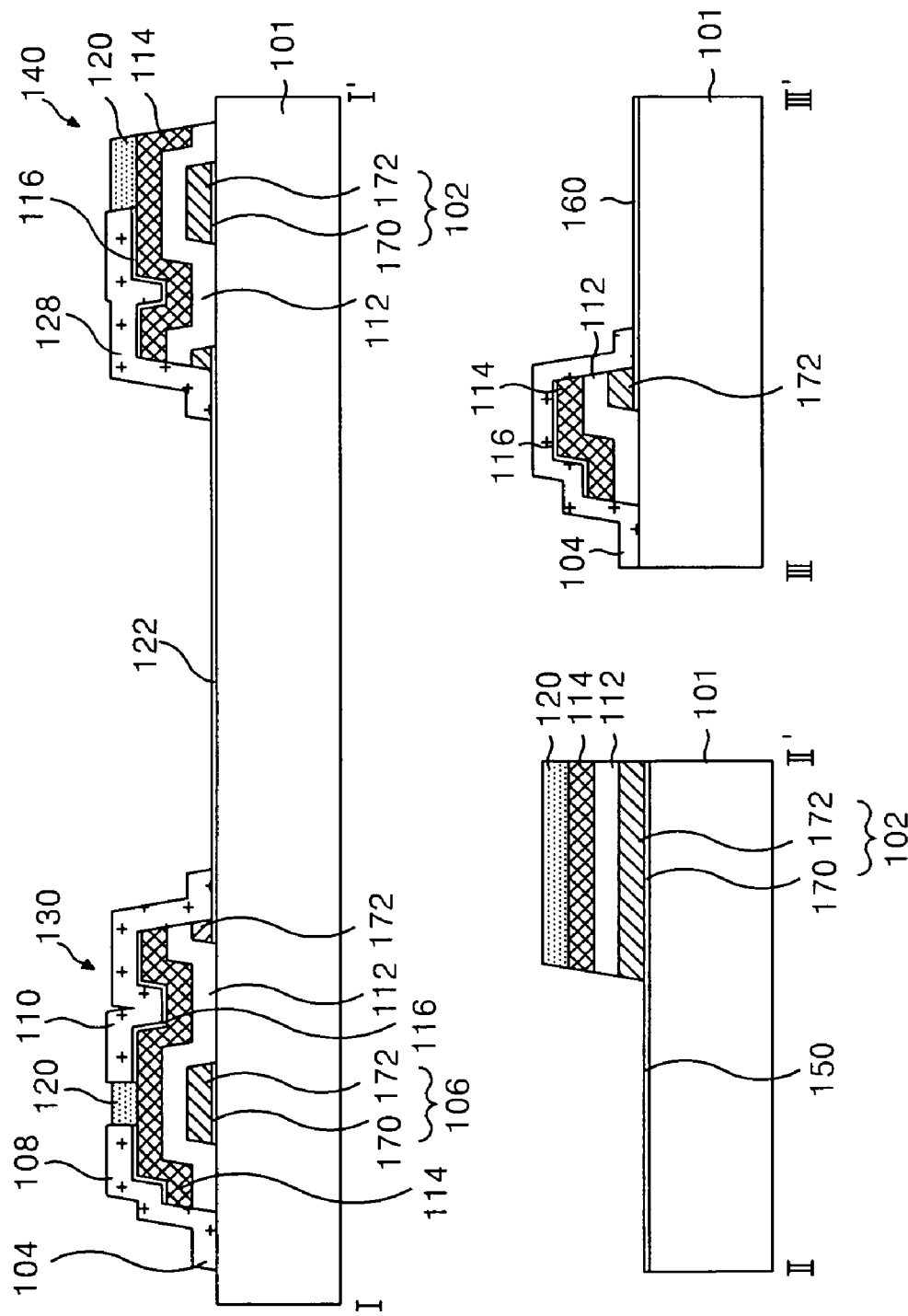

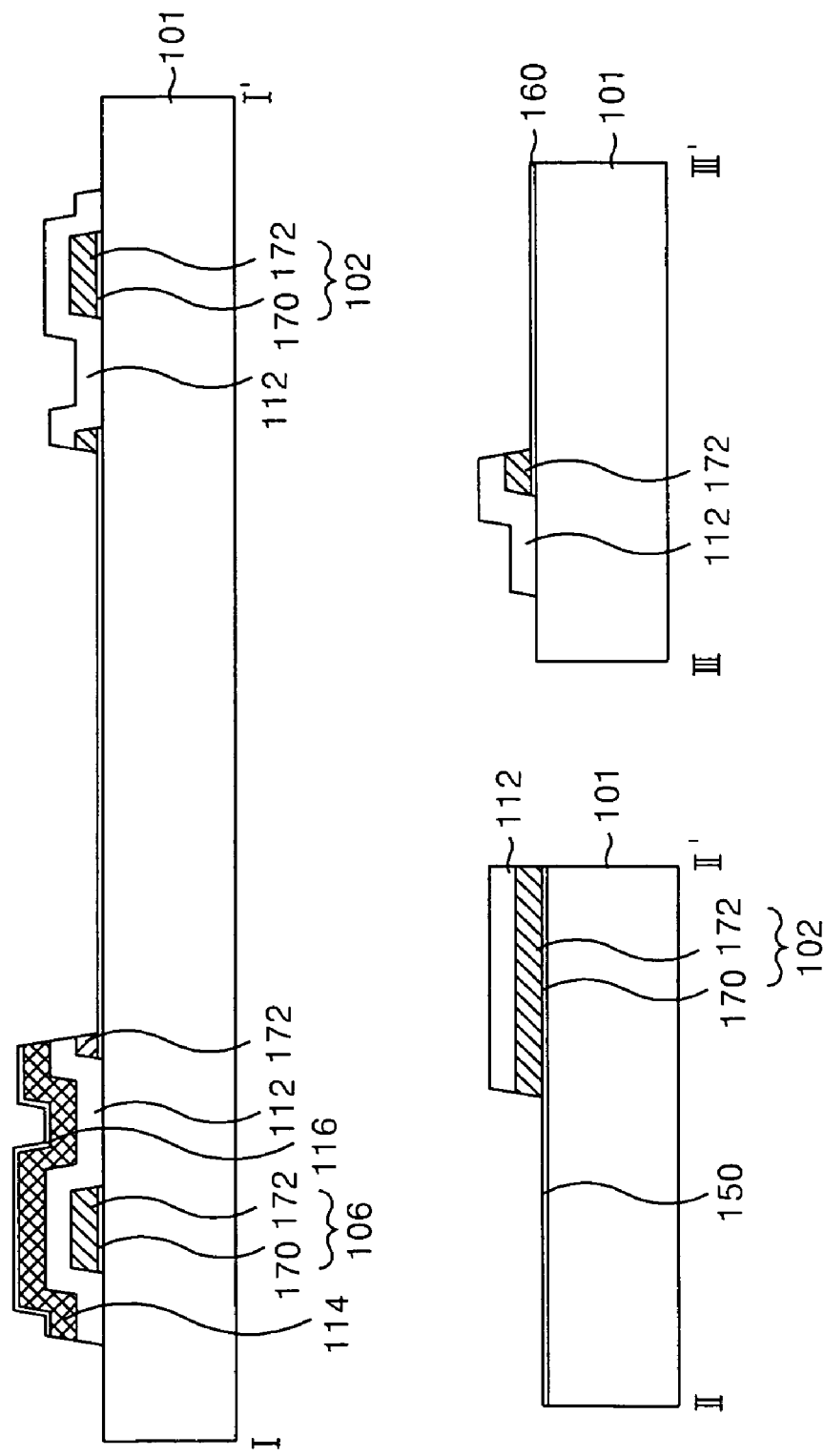

THIN FILM TRANSISTOR SUBSTRATE AND FABRICATING METHOD THEREOF

This application claims the benefit of the Korean Patent Application No. P2005-58058 filed on Jun. 30, 2005, which is hereby incorporated by reference.

TECHNICAL FIELD

The present invention relates to a thin film transistor substrate and a fabricating method thereof, and more particularly to a thin film transistor substrate that is adaptive for reducing the number of mask processes, and a fabricating method thereof.

DESCRIPTION OF THE RELATED ART

A liquid crystal display device controls light transmittance through a liquid crystal layer by use of an electric field to display a picture. The liquid crystal display device, as shown in FIG. 1, includes a thin film transistor substrate 70 and a color filter substrate 80 which face each other with liquid crystal 76 therebetween.

The color filter substrate 80 contains various layers forming a color filter array on an upper substrate 11. The color filter array includes a black matrix 68 for preventing light leakage therethrough, a color filter 62 that realizes various colors, a common electrode 64 which forms a vertical electric field with a pixel electrode 72 formed on a lower substrate 1, and an upper alignment film spread thereover for aligning the liquid crystal.

The thin film transistor substrate 70 contains a thin film transistor array formed on a lower substrate 1. The thin film transistor array includes gate lines 82 and data lines 74 that cross each other, thin film transistors 58 formed at crossings of the gate lines 82 and data lines 74, pixel electrodes 72 connected to the thin film transistors 58, and a lower alignment film spread thereover for aligning the liquid crystal.

In such a liquid crystal display device, the thin film transistor array substrate includes a large number of processes, including multiple mask processes, during fabrication. Each mask process, in turn, includes multiple processes such as thin film deposition, cleaning, photolithography, etching, photo-resist stripping, inspection, etc. The overall fabricating process is thus complicated and increases the cost of the liquid crystal display panel. Accordingly, it is desirable to reduce the number of mask processes in fabricating the thin film transistor array substrate.

SUMMARY

By way of introduction only, in one embodiment, a thin film transistor substrate comprises a gate line on a liquid crystal display substrate and a data line which crosses the gate line with a gate insulating pattern therebetween to provide a pixel area. A thin film transistor is formed in the pixel area. The thin film transistor has a semiconductor pattern which forms a channel and has one or more semiconductor layers. A pixel electrode is disposed in the pixel area and containing a transparent conductive film. A gate metal film is adjacent to the transparent conductive film in a portion of the pixel area. A semiconductor passivation film is disposed on a portion of the semiconductor pattern corresponding to the channel. The semiconductor passivation film contains a plasma-exposed semiconductor. A gate pad is connected with the gate line and may contain the transparent conductive film and the gate metal film in a connection area connecting the gate pad and the gate line and the transparent conductive film in a pad section. A data pad connected with the data line similarly may contain the transparent conductive film. A storage electrode may be formed which overlaps the gate line with the gate insulating pattern therebetween and is connected to the pixel electrode so as to form a storage capacitor.

In another embodiment, a method of fabricating a thin film transistor substrate comprises: depositing a transparent conductive film, a gate metal film, a gate insulating film, and a semiconductor on a liquid crystal display substrate; patterning the gate metal film and the transparent conductive film to form a pixel electrode and a gate pattern that includes a gate line, a gate electrode, a gate pad and a data pad; patterning the semiconductor and the gate insulating film to form a semiconductor pattern and a gate insulating pattern and to expose the transparent conductive film of the gate pad, the data pad and the pixel electrode; forming a data pattern that includes a data line, a source electrode, and a drain electrode on the semiconductor pattern; and forming a semiconductor passivation film on an exposed active layer of the semiconductor pattern.

In another embodiment, a method of fabricating a thin film transistor substrate comprises: depositing a transparent conductive film, an opaque gate film, a gate insulating film, and a semiconductor sequentially on a liquid crystal display substrate; forming a pixel electrode and a gate pattern that includes a gate line, a gate electrode, a gate pad and a data pad from at least one of the opaque gate film and the transparent conductive film; patterning the semiconductor and the gate insulating film to form a semiconductor pattern and a gate insulating pattern on the gate pattern and the pixel electrode and to expose the transparent conductive film of the gate pad, the data pad and the pixel electrode; forming a data pattern that includes a data line, a source electrode, and a drain electrode on the semiconductor pattern; and forming a semiconductor passivation film on a channel of the semiconductor pattern by exposing an active layer in the channel to at least one of an oxygen or nitrogen plasma.

BRIEF DESCRIPTION OF THE DRAWINGS

The following detailed description reference the accompanying drawings, in which:

FIGS. 5A and 5B are a plan view and a cross sectional diagram representing a second mask process of a thin film transistor substrate shown in FIGS. 2 and 3;

FIGS. 7A and 7C are cross sectional diagrams representing the third mask process shown in FIGS. 6A and 6B in detail;

FIGS. 9A to 9D are cross sectional diagrams representing a second mask process of the thin film transistor substrate shown in FIG. 8 in detail.

DETAILED DESCRIPTION OF THE PREFERRED EMBODIMENT

Figure 1:
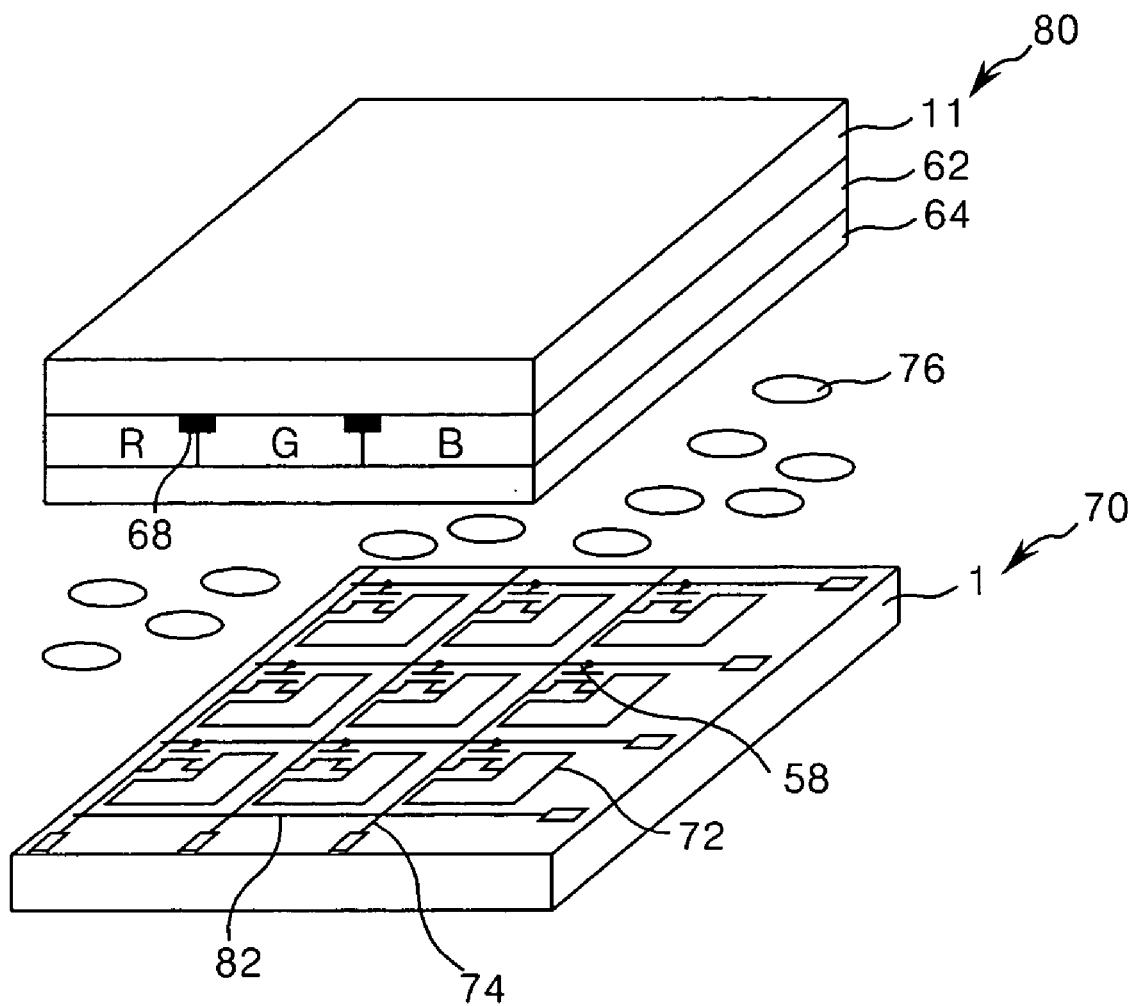
FIG. 1 is a perspective plan view representing a liquid crystal display panel of the related art.
Figure 2:
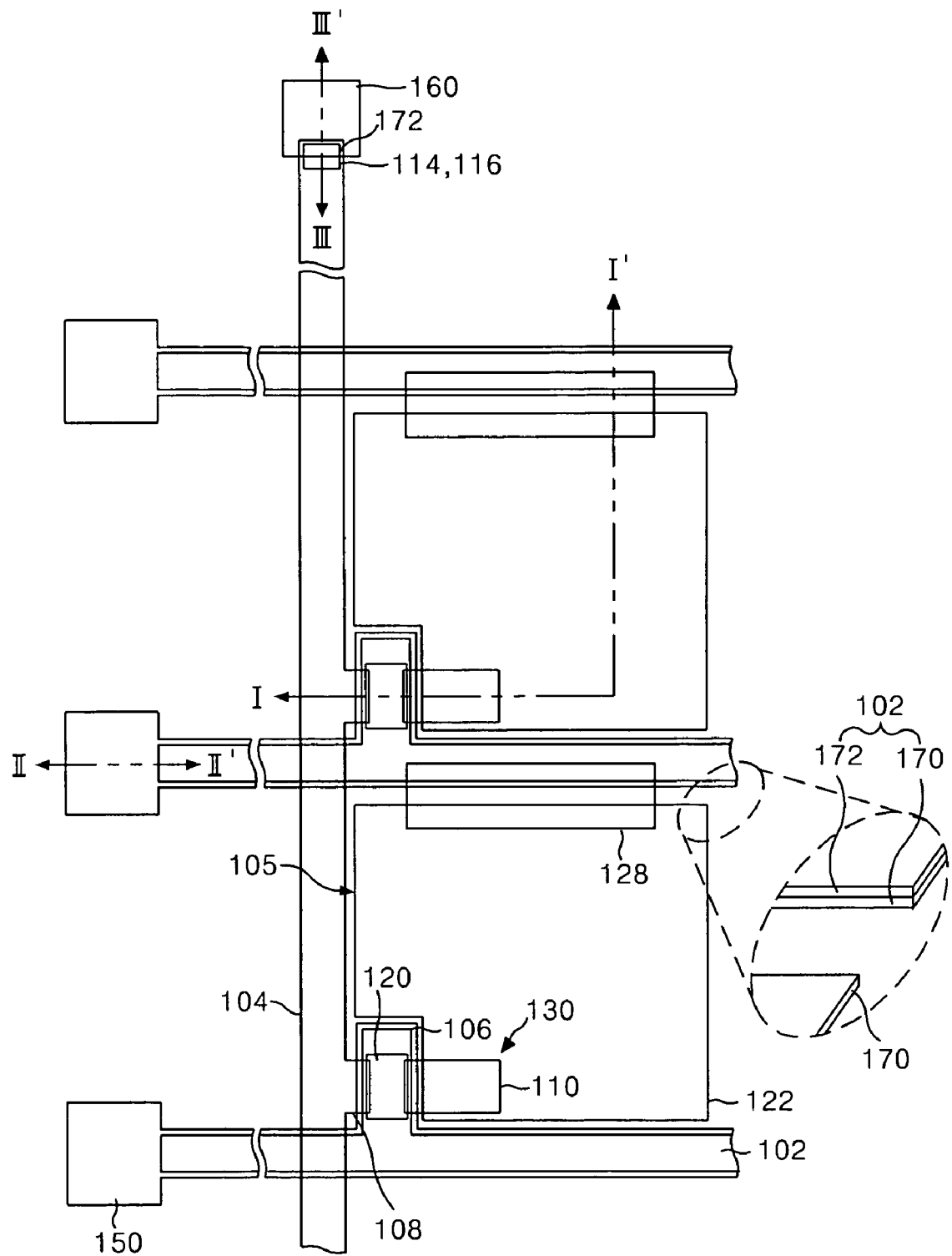
FIG. 2 is a plan view representing a thin film transistor substrate according to a first embodiment of the present invention.
Figure 3:
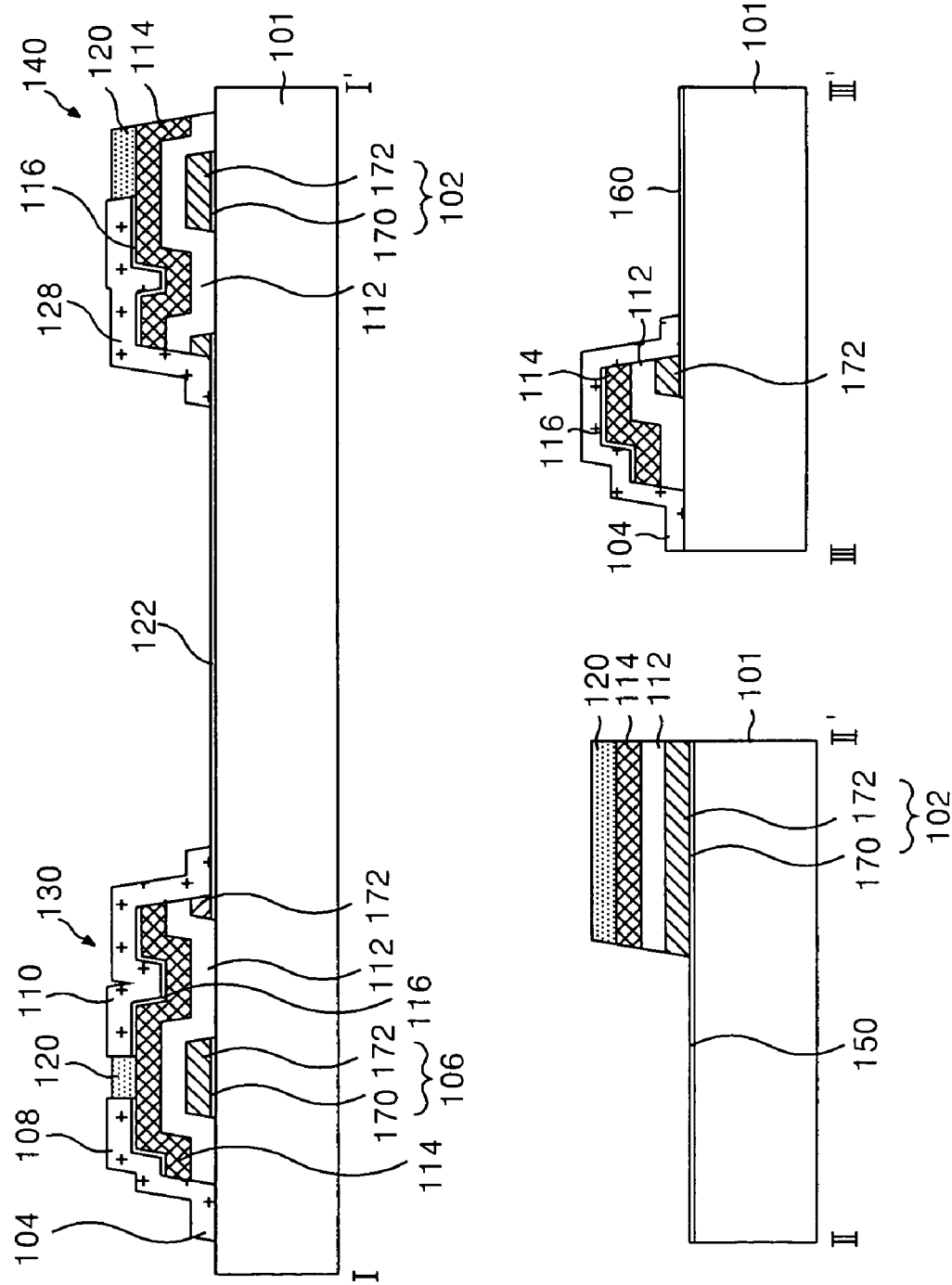
FIG. 3 is a cross sectional diagram illustrating the thin film transistor substrate shown in FIG. 2, taken along the lines I-I', II-II' and III-III'.

Reference will now be made in detail to the preferred embodiments of the present invention, examples of which are illustrated in the accompanying drawings. With reference to FIGS. 2 to 9D, embodiments of the present invention will be explained as follows. FIG. 2 is a plan view representing a thin film transistor substrate of a liquid crystal display panel according to a first embodiment of the present invention, and FIG. 3 is a cross sectional diagram representing the thin film transistor substrate taken along the lines I-I, II-II', III-III' in FIG. 2.

The thin film transistor substrate shown in FIGS. 2 and 3 includes a gate line 102 and a data line 104 formed on a lower substrate 101 to cross each other with a gate insulating pattern 112 therebetween; a thin film transistor 130 formed at each crossing part thereof; a pixel electrode 122 formed in a pixel area 105 provided by the crossing structure; a semiconductor passivation film 120 for protecting a channel of the thin film transistor 130; a storage capacitor 140 formed in an overlapping part of the pixel electrode 122 and the gate line 102; a gate pad 150 extended from the gate line 102; and a data pad 160 extended from the data line 104. The gate line 102 supplying a gate signal and the data line 104 supplying a data signal cross each other to define a pixel area 105.

The thin film transistor 130 permits a pixel signal of the data line 104 to be charged and sustained in the pixel electrode 122 in response to a gate signal of the gate line 102. To this end, the thin film transistor 130 includes a gate electrode 106 connected to the gate line 102; a source electrode 108 connected to the data line 104; and a drain electrode 110 connected to the pixel electrode 122. The thin film transistor 130 also includes a semiconductor pattern 114, 116 which overlaps the gate electrode 106 with the gate insulating pattern 112 therebetween to form a channel between the source electrode 108 and the drain electrode 110.

A gate pattern includes the gate electrode 106 and the gate line 102. The gate pattern has a multi-layer structure containing a transparent conductive film 170 and a gate metal layer 172 on the transparent conductive film 170. The gate pad 150 is connected to a gate driver (not shown) to supply the gate signal generated in the gate driver to the gate line 102. In the gate pad 150, the transparent conductive film 170 extending from the gate line 102 is exposed.

The semiconductor pattern forms a channel between the source electrode 108 and the drain electrode 110, and includes an active layer 114 that partially overlaps the gate pattern with the gate insulating pattern 112 therebetween. The semiconductor pattern also includes an ohmic contact layer 116 formed on the active layer 114. The ohmic contact layer 116 establishes ohmic contact between the active layer 114 and a storage electrode 128, the source electrode 108, and the drain electrode 110.

The semiconductor passivation film 120 is formed of silicon oxide SiOx or silicon nitride SiNx on the active layer 114 which forms a channel between the source electrode 108 and the drain electrode 110. The semiconductor passivation film 120 prevents the channel portion of the active layer 114 from being exposed. The semiconductor passivation film 120 also prevents the active layer 114, which is formed along the gate line 102 with the gate insulating pattern 112 therebetween, from being exposed.

The pixel electrode 122 is directly connected to the drain electrode 110 of the thin film transistor 130. The pixel electrode 122 includes a transparent conductive film 170 formed in a pixel area and a gate metal layer 172 formed on the transparent conductive film 170 of an area which overlaps the semiconductor pattern. The gate metal layer 172 of the pixel electrode 122 has a relatively high conductivity compared to the conductivity of the transparent conductive film 170.

Accordingly, an electric field is formed between the pixel electrode 122 to which the pixel signal is supplied through the thin film transistor 130 and a common electrode (not shown) to which the reference voltage is supplied. The electric field causes liquid crystal molecules between the color filter substrate and the thin film transistor substrate to rotate by dielectric anisotropy. Transmittance of the light which is transmitted through the liquid crystal in the pixel area 105 is changed in accordance with the extent of rotation of the liquid crystal molecules, thereby realizing gray levels in the pixel area 105.

The storage capacitor 140 includes the gate line 102 and the storage electrode 128. The storage electrode 128 overlaps the gate line 102 and the gate insulating pattern 112, the active layer 114, and the ohmic contact layer 116 are disposed between the gate line 102 and the storage electrode 128. The storage electrode 128 is connected to the pixel electrode 122. The storage capacitor 140 maintains the pixel signal charged in the pixel electrode 122 until the next pixel signal is charged in the pixel electrode 122.

The data pad 160 is connected to a data driver (not shown) to supply the data signal generated in the data driver to the data line 104. In the data pad 160, in one embodiment, only the gate metal layer 172 is formed in a contact area and the gate metal layer 172 is formed on the transparent conductive film 170 in a connection area which overlaps the data line 104. The gate metal layer 172 of the data pad 160 has a relatively high conductivity to compensate for the more resistive transparent conductive film 170. The gate insulating pattern 112, the active layer 114, and the ohmic contact layer 116 are formed between the data line 104 and the gate metal layer 172 of the data pad 160.

Figure 4A:
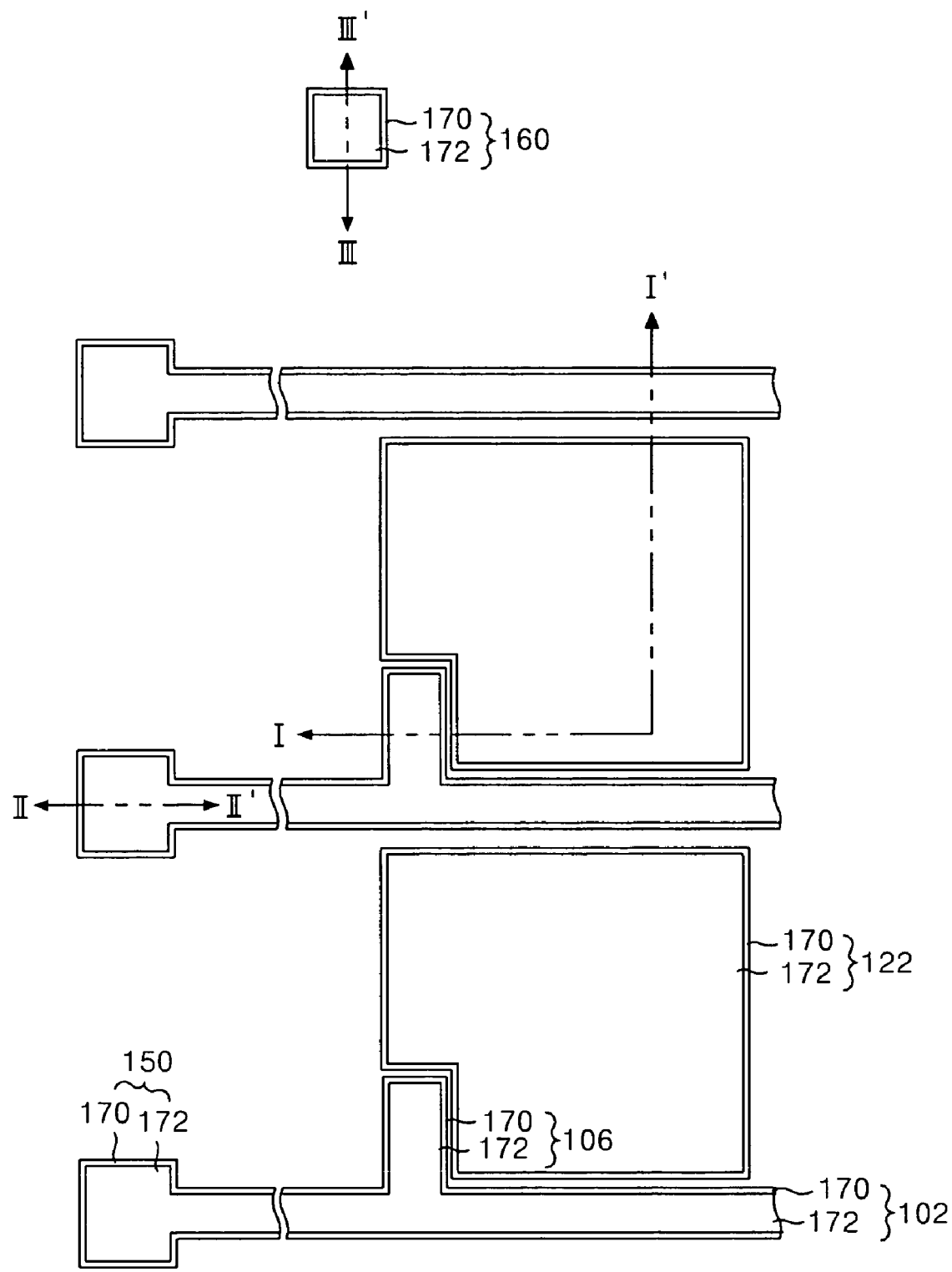
FIGS. 4A and 4B are a plan view and a cross sectional diagram representing a first mask process of a thin film transistor substrate shown in FIGS. 2 and 3.
Figure 4B:
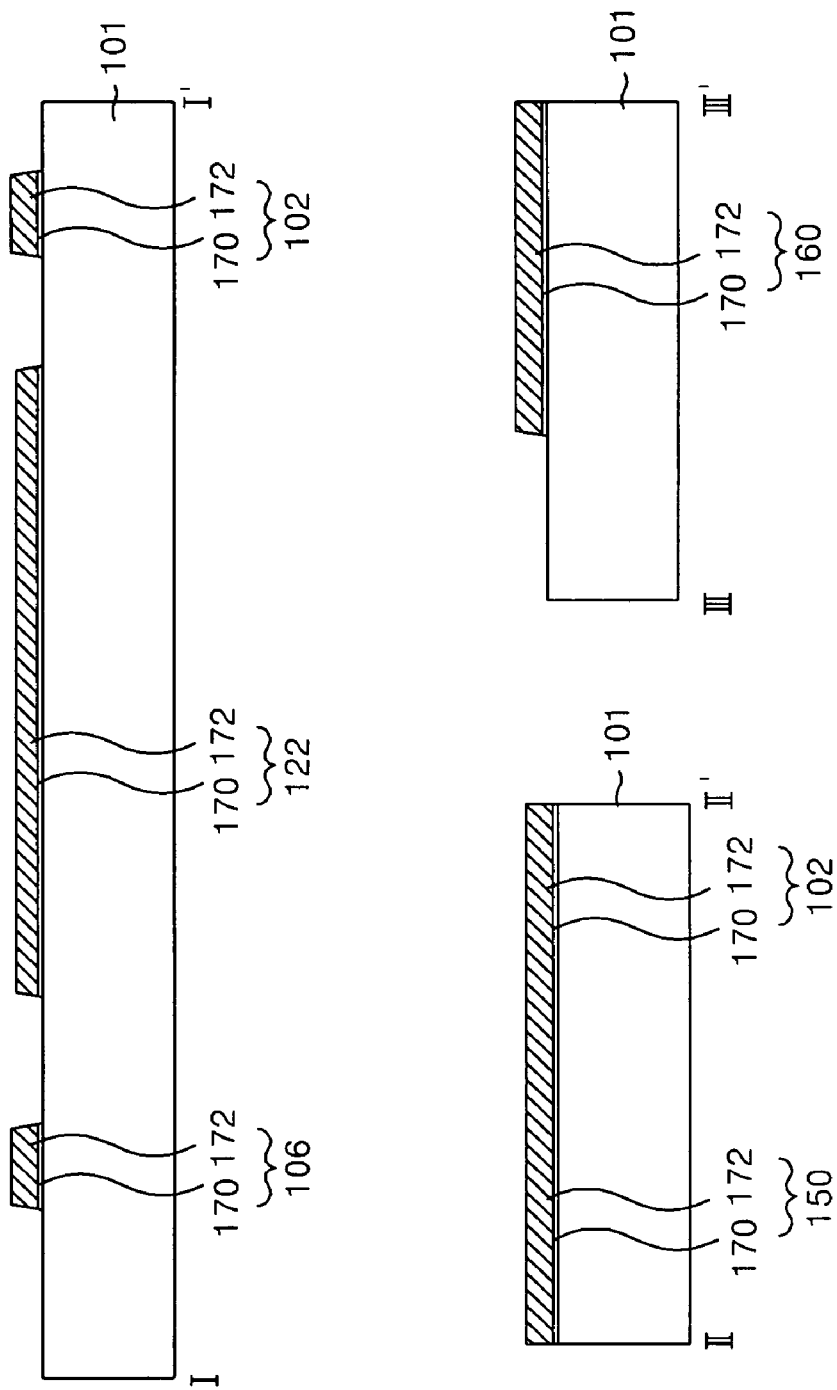

FIGS. 4A and 4B are a plan view and a cross sectional view for explaining a first mask process in a fabricating method of a thin film transistor array substrate according to a first embodiment of the present invention. As illustrated in FIGS. 4A and 4B, the pixel electrode 122 and the gate pattern are formed on the lower substrate 101 by a first mask process. The gate pattern includes the gate line 102, the gate electrode 106, the gate pad 150 and the data pad 160. The pixel electrode 122 and the gate pattern have a double layer structure that includes the transparent conductive film 170 and the gate metal layer 172. The transparent conductive film 170 and the gate metal layer 172 are sequentially formed on the lower substrate 101 by a deposition method such as sputtering. The transparent conductive film 170 is formed of a transparent conductive material such as indium tin oxide ITO, tin oxide TO, indium tin zinc oxide ITZO, indium zinc oxide IZO, etc. The gate metal layer 172 is formed of a metal such as aluminum Al or an aluminum alloy (e.g. aluminum/neodymium (AlNd)), molybdenum Mo, copper Cu, chrome Cr, tantalum Ta, titanium Ti, etc. Subsequently, the transparent conductive film 170 and the gate metal layer 172 are patterned by photolithography and etching using a first mask, thereby forming the gate line 102 and the gate electrode 106 a gate pad 150, the data pad 160, and the pixel electrode 122 having a double layer structure.

Figure 5A:
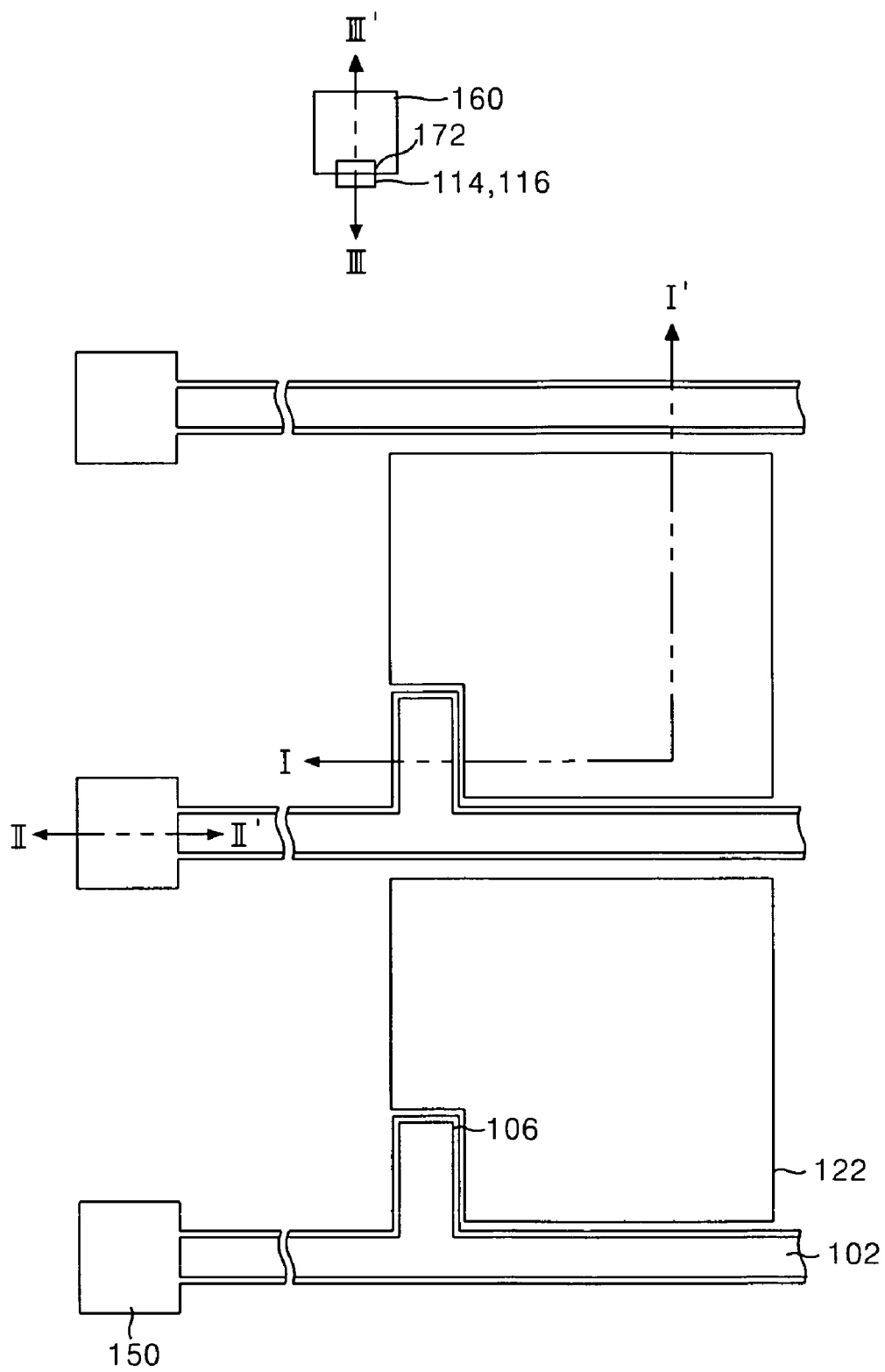

FIGS. 5A and 5B are a plan view and a cross sectional view for explaining a second mask process in the fabricating method of the thin film transistor array substrate according to the first embodiment of the present invention. As shown in FIGS. 5A and 5B, the gate insulating pattern 112 and the semiconductor pattern are formed on the lower substrate 101 where the gate pattern is formed by a second mask process. The semiconductor pattern includes the active layer 114 and the ohmic contact layer 116. More specifically, a gate insulating film and first and second semiconductor layers are sequentially formed on the lower substrate 101 where the gate pattern is formed, by deposition such as PECVD, sputtering. The gate insulating film may be an inorganic insulating material such as silicon oxide SiOx or silicon nitride SiNx. The first semiconductor layer may be formed of unintentionally doped amorphous silicon and the second semiconductor layer may be formed amorphous silicon doped with N-type or P-type impurities. Subsequently, the first and second semiconductor layers and the gate insulating film are patterned by photolithography and etching using the second mask, thereby forming the gate insulating pattern 112 which overlaps the gate line 102 and the gate electrode 106 and forming the semiconductor pattern that includes the active layer 114 and the ohmic contact layer on the gate insulating pattern 112. The exposed gate metal layer 172 of the data pad 160, the gate pad 150 and the pixel electrode 122 is then removed by using the gate insulating pattern 112 as a mask, thereby exposing the transparent conductive film 170 in the data pad 160, the gate pad 150 and the pixel electrode 122.

Figure 6A:
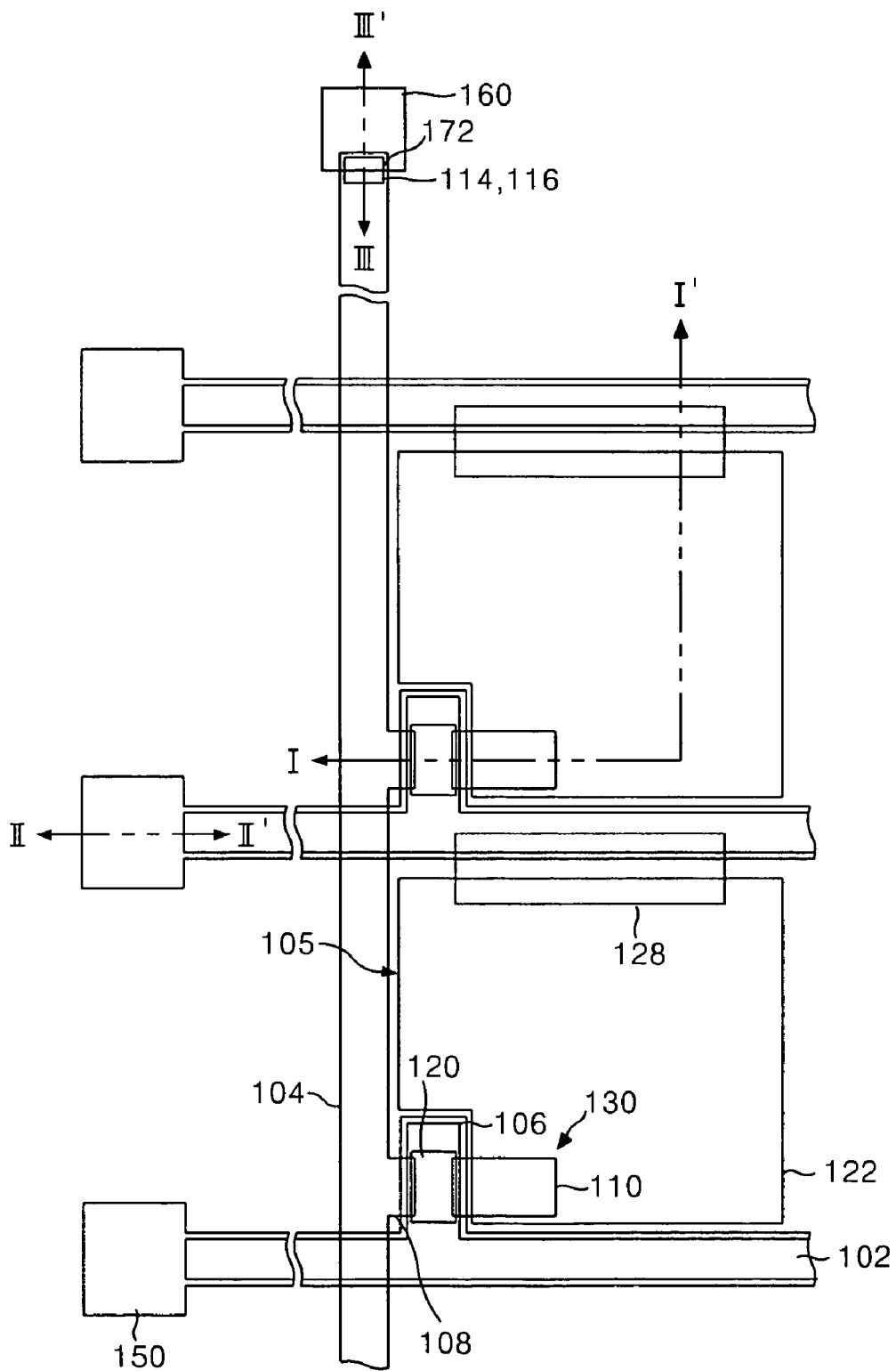
FIGS. 6A and 6B are a plan view and a cross sectional diagram representing a third mask process of a thin film transistor substrate shown in FIGS. 2 and 3.
Figure 6B:
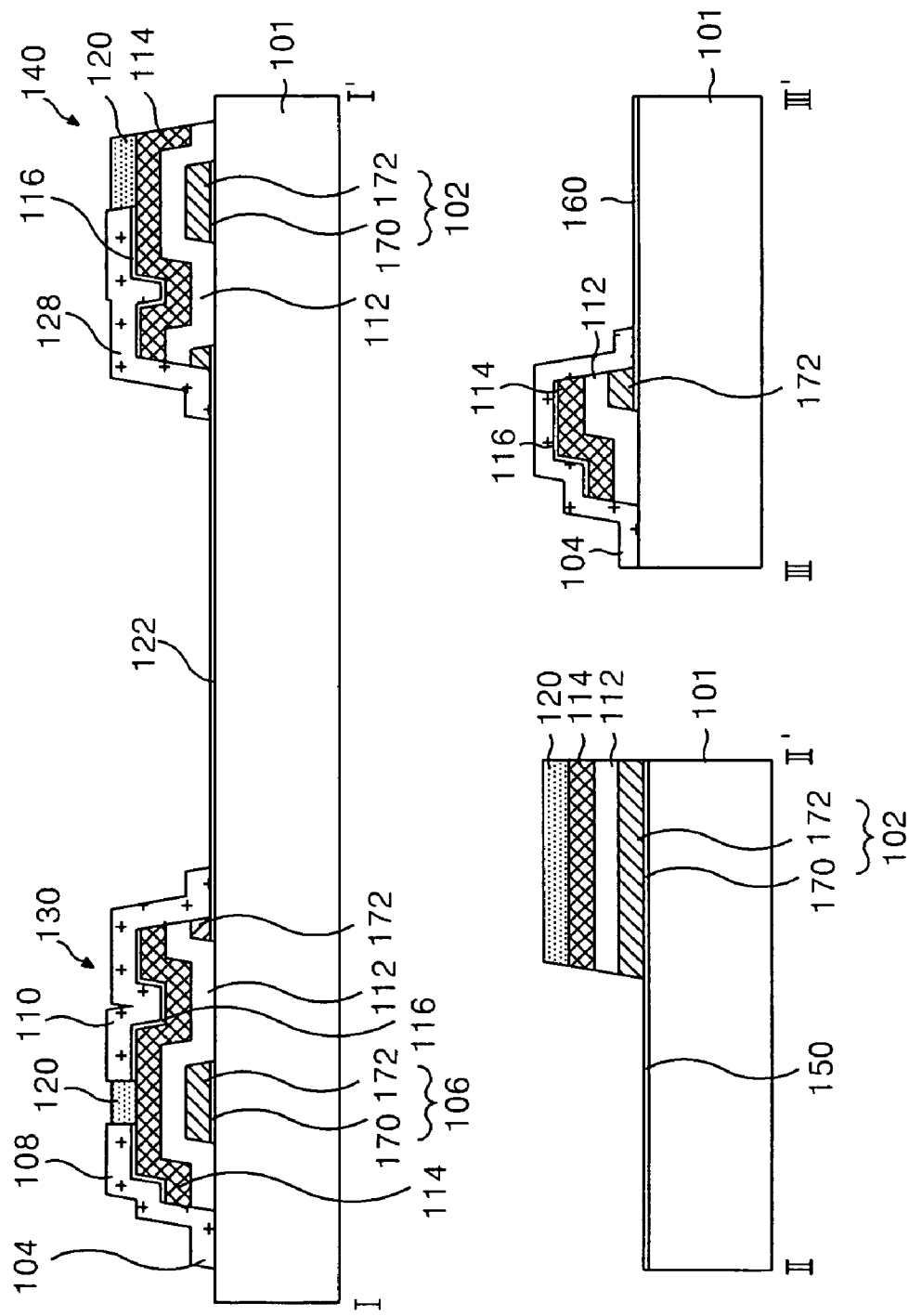

FIGS. 6A and 6B are a plan view and a cross sectional view for explaining a third mask process in the fabricating method of the thin film transistor array substrate according to the first embodiment of the present invention. As shown in FIGS. 6A and 6B, a data pattern that includes the data line 104, the source electrode 108, the drain electrode 110 and the storage electrode 128, and the semiconductor passivation film 120 which protects the channel between the source electrode 108 and the drain electrode 110 are formed on the lower substrate 101 where the gate insulating pattern 112 and the semiconductor pattern are formed by the third mask process. In reference to FIGS. 7A to 7C, the third mask process will be described in detail as follows.

As shown in FIG. 7A, a data metal layer 109 is formed on the lower substrate 101 where the semiconductor pattern is formed, by a deposition method such as sputtering. The data metal layer 109 is formed of a metal such as molybdenum Mo, copper Cu, etc. The data metal layer is patterned by photolithography and etching, thereby forming the data pattern that includes the storage electrode 128, the data line 104, the source electrode 108 and the drain electrode 110, as shown in FIG. 7B. The exposed ohmic contact layer 116 is then removed by dry etching using the data pattern as a mask, thereby exposing the active layer 114 which forms the channel of the thin film transistor 130 and the active layer 114 on the gate line 102.

The surface of the exposed active layer 114, as shown in FIG. 7C, is then exposed to an Ox (for example, $O_2$) and/or Nx (for example, $N_2$) plasma. The ions in the plasma react with the silicon in the active layer 114, to form the semiconductor passivation film 120. Accordingly, the semiconductor passivation film 120 can include SiO2 and/or SiNx on the active layer 114. The semiconductor passivation film 120 prevents damage to the active layer 114 in the channel region which would otherwise be exposed to a cleaning solution used in the subsequent cleaning process.

Figure 8:
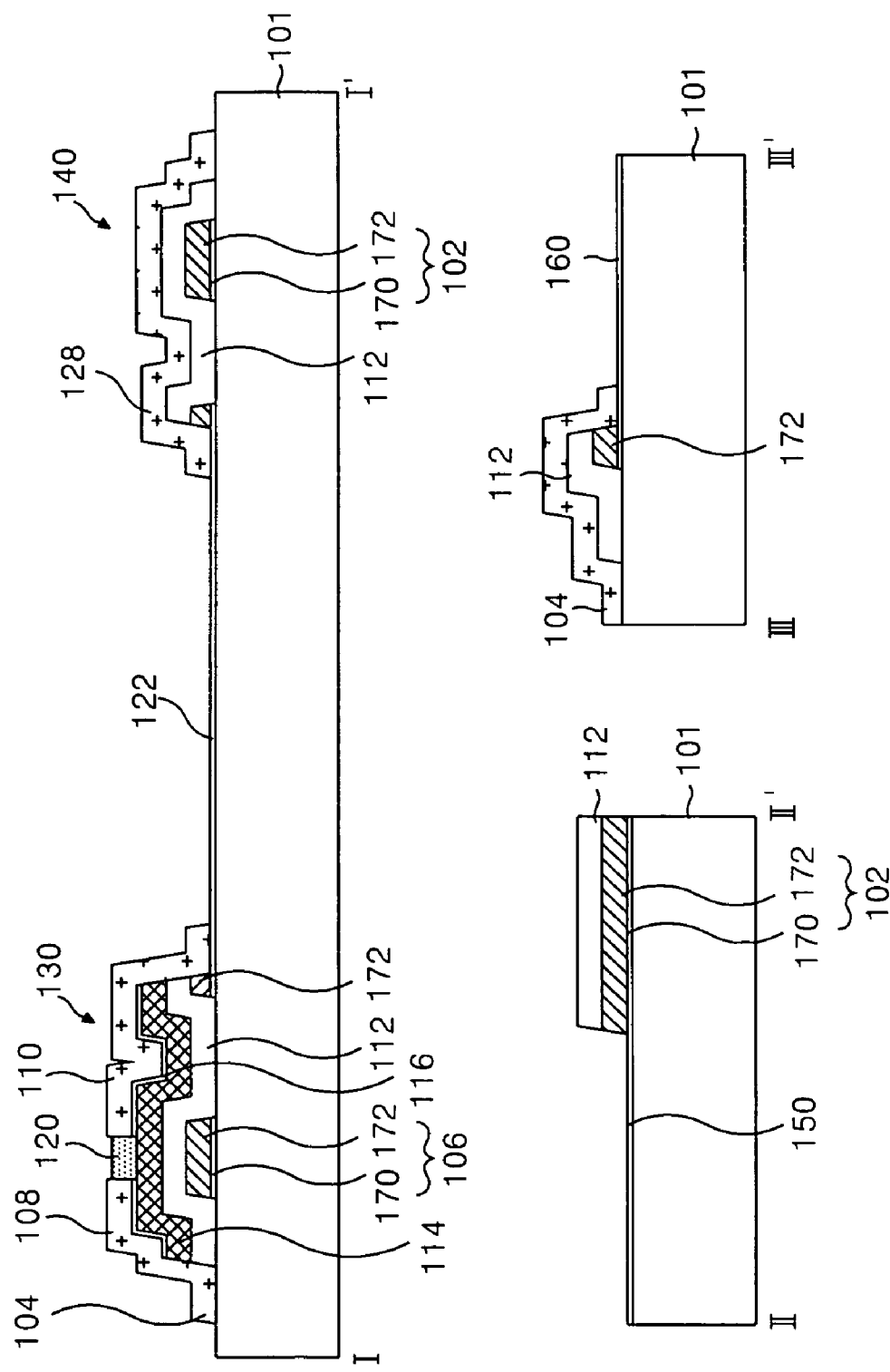
FIG. 8 is a cross sectional diagram representing a thin film transistor substrate according to a second embodiment of the present invention.

FIG. 8 is a cross sectional view representing a thin film transistor substrate according to a second embodiment of the present invention. Referring to FIG. 8, the thin film transistor substrate according to the second embodiment of the present invention includes the same components as the thin film transistor substrate shown in FIG. 3 except the semiconductor pattern is not formed in the storage capacitor 140. Accordingly, a detail description for the same components will be omitted.

The storage capacitor 140 includes the gate line 102 and the storage electrode 128 which overlaps the gate line with the gate insulating pattern 112 therebetween. As before, the storage electrode 128 is connected to the pixel electrode 122. The storage capacitor 140 maintains the pixel signal charged in the pixel electrode 122 until the next pixel signal is charged. The storage capacitor 140 shown in FIG. 8 has a relatively higher capacitance than the capacitance of the storage capacitor of FIG. 3 because the distance between the gate line 102 (the storage lower electrode) and the storage electrode 128 (the storage upper electrode) is smaller.

The data pad 160 is connected to the data driver (not shown) to supply the data signal generated in the data driver to the data line 104. The data pad 160 contains the transparent conductive film 170 and the gate metal layer 172 in an area which overlaps the data line 104 on the transparent conductive film 170. The gate metal layer 172 of the data pad 160 has a relatively high conductivity to compensate for the more resistive transparent conductive film 170. The gate metal layer 172 of the data pad 160 overlaps the data line 104 with the gate insulating pattern therebetween. The semiconductor pattern is thus formed on the gate insulating pattern which overlaps the gate electrode 106.

Figure 9A:
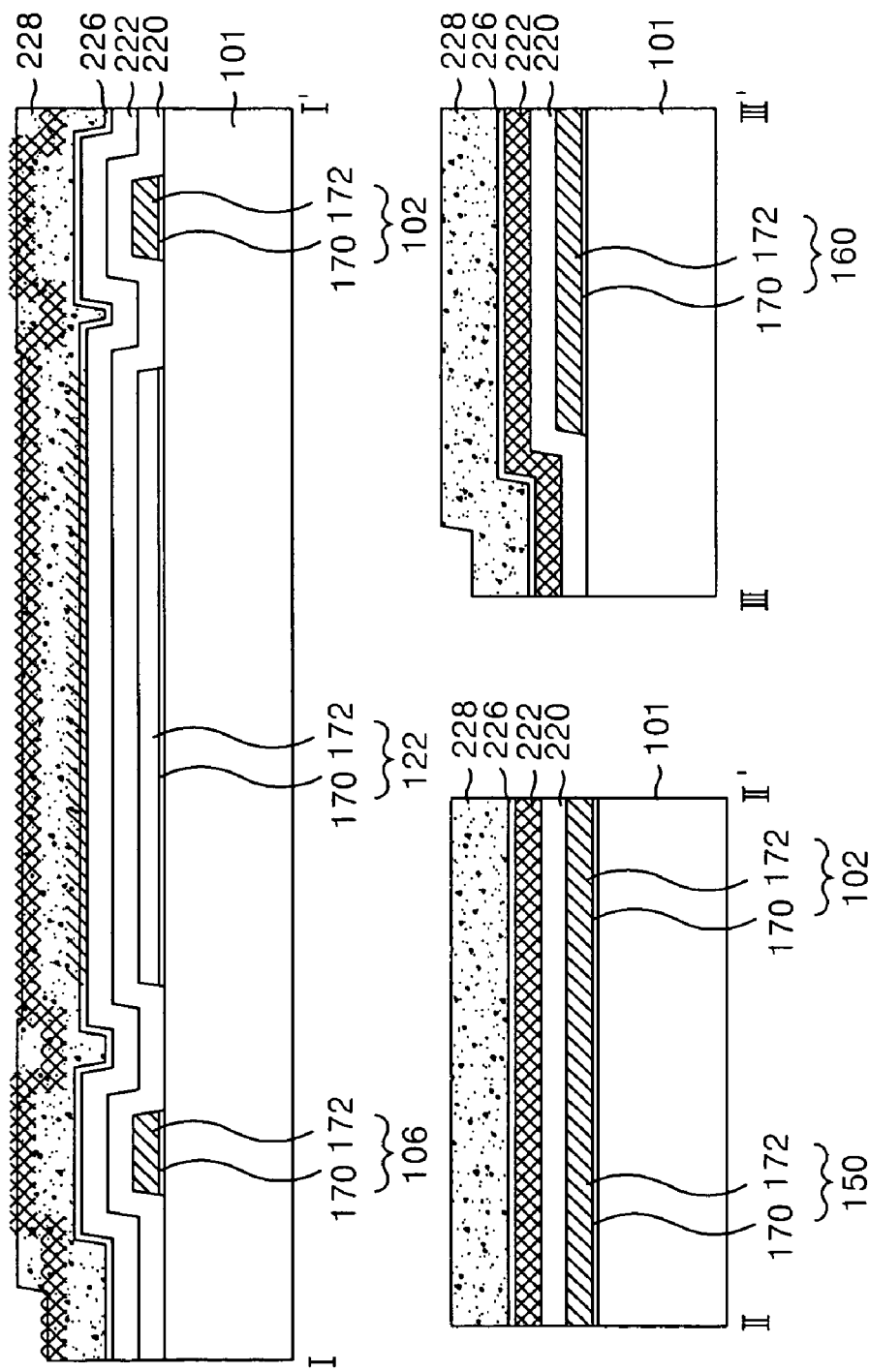
Figure 9B:
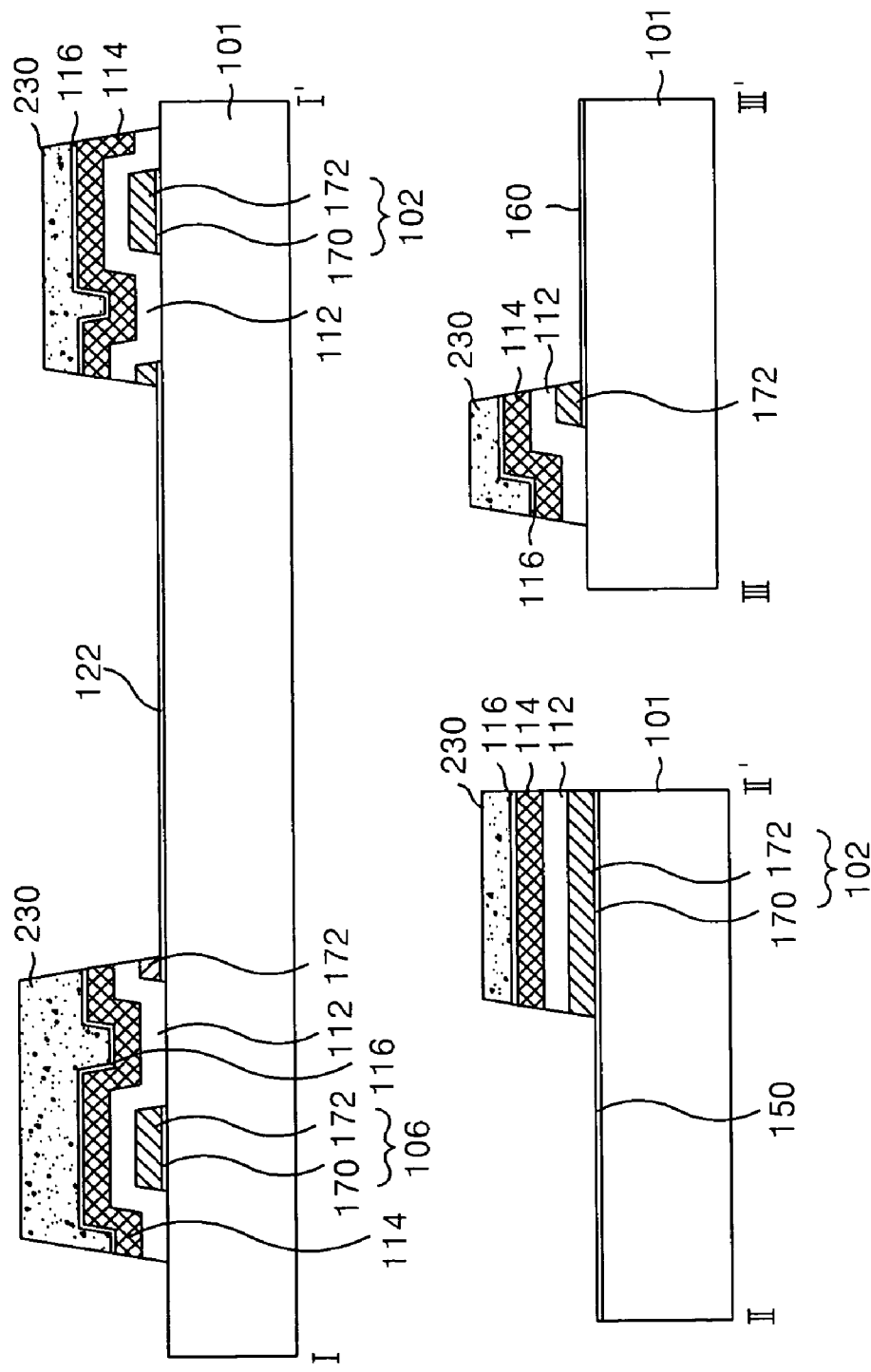

FIGS. 9A to 9D are cross sectional diagrams for explaining a second mask process of the thin film transistor substrate shown in FIG. 8. As shown in FIG. 9A, a gate insulating film 220, first and second semiconductor layers 222, 226 and a photo-resist film 228 are sequentially formed on the lower substrate where the gate pattern is formed. These layers are formed by a deposition method such as sputtering.

A partial exposure mask is aligned to an upper part of the lower substrate 101. The partial exposure mask includes a transparent mask substrate containing an exposure area, a shielding portion formed in a shielding area of the mask substrate, and a diffractive exposure portion (or transflective part) formed in a partial exposure area of the mask substrate. The photo-resist film 228 is developed after being exposed using the partial exposure mask, thereby forming a photo-resist pattern 230 shown in FIG. 9B. The photo-resist pattern 230 has a stepped difference between the shielding area and the partial exposure area such that the photo-resist pattern 230 in the partial exposure area has a height which is lower than a height of the photo-resist pattern 230 that is formed in the shielding area.

Figure 9C:
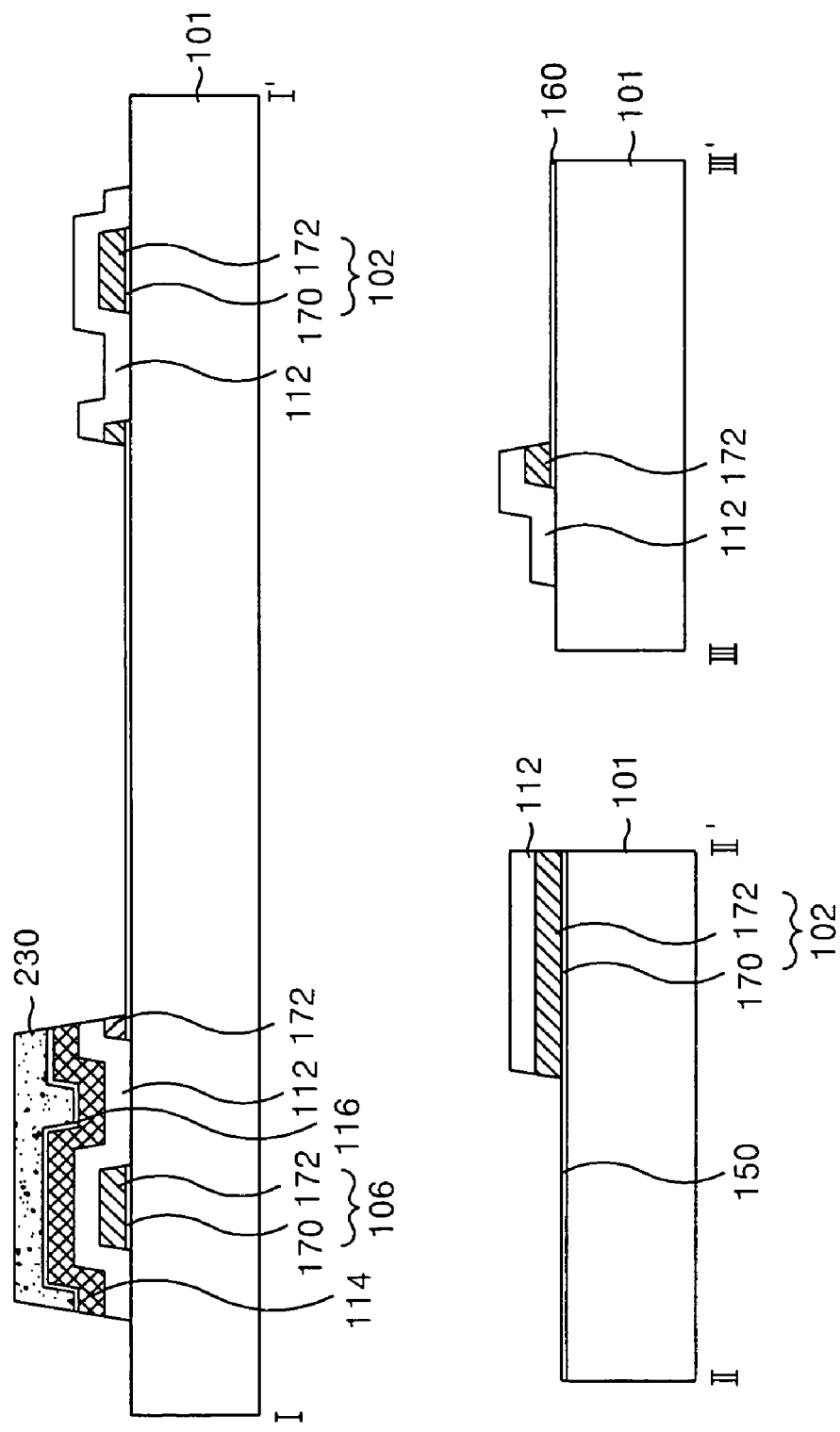

The gate insulating film 220, the first and second semiconductor layers 222, 226 are patterned by dry etching using the photo-resist pattern 230 as a mask, thereby forming the gate insulating pattern 112, the active layer 114 and the ohmic contact layer 116 which have the same pattern. Subsequently, the photo-resist pattern 230 is ashed using an oxygen $O_2$ plasma such that the photo-resist pattern 230 in the partial exposure area is removed and the height of the photo-resist pattern 230 in the shielding area is decreased, as shown in FIG. 9C. The active layer 114 and the ohmic contact layer 116 which are formed on the partial exposure area, i.e., on the area other than that of the thin film transistor 130, are removed by etching using the photo-resist pattern 230. The photo-resist pattern 230 remaining on the semiconductor pattern is then removed by stripping, as shown in FIG. 9D.

As described above, the thin film transistor substrate and the fabricating method thereof according to the present invention forms a pixel electrode and a gate pattern by a first mask process, forms a semiconductor pattern by a second mask process, and forms a data pattern by a third mask process, thereby completing the thin film transistor array substrate. In this way, the thin film transistor array substrate is formed by three mask processes without using a lift-off process or a pad open process. This simplifies the structure and fabricating method thereof, reduces the manufacturing unit cost, and improves the manufacturing yield.

Further, the thin film transistor array substrate and the fabricating method thereof according to the present invention protects the exposed active layer corresponding to the channel of the thin film transistor by use of a semiconductor passivation film rather than a separate passivation film. Accordingly, it is possible to avoid the use of deposition equipment or coating equipment for forming a passivation film, thereby reducing the manufacturing cost. Disconnection of the pixel electrode from the drain electrode, caused by a stepped difference part in a contact hole which exposes the drain electrode in the related art, may likewise be avoided.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. A thin film transistor substrate, comprising:
   a gate line on a liquid crystal display substrate;
   a data line which crosses the gate line with a gate insulating pattern therebetween to provide a pixel area;
   a thin film transistor formed in the pixel area, the thin film transistor having a gate electrode connected to the gate line, a semiconductor pattern which forms a channel, a source electrode connected to the data line, a drain electrode which faces the source electrode with the semiconductor pattern therebetween;
   a pixel electrode consisted of a transparent conductive film in the pixel area and a gate metal film deposited on the transparent conductive film; and
   a semiconductor passivation film on an exposed active layer of the semiconductor pattern corresponding to the channel, the semiconductor passivation film containing a plasma-exposed semiconductor;
   wherein a length of the semiconductor passivation film on the exposed active layer is same with a length of the exposed active layer corresponding to the channel.

2. The thin film transistor substrate according to claim 1, further comprising a source electrode and a drain electrode that oppose each other with the semiconductor passivation film disposed therebetween,
   wherein the semiconductor pattern includes:
   the active layer; and
   an ohmic contact layer disposed between the active layer and the source and drain electrodes, the ohmic contact layer having a hole through which the semiconductor passivation film contacts the active layer between the source and drain electrodes.

3. The thin film transistor substrate according to claim 1, further comprising a data pad and a gate electrode containing the gate metal film, the gate electrode extending from the gate line, wherein the semiconductor pattern is disposed along the gate line with the gate insulating pattern therebetween and overlaps the gate metal film of the data pad and the gate electrode.

4. The thin film transistor substrate according to claim 3, wherein the gate insulating pattern has the same pattern as an active layer of the semiconductor pattern.

5. The thin film transistor substrate according to claim 2, wherein the semiconductor passivation film comprises at least one of silicon oxide or silicon nitride.

6. The thin film transistor substrate according to claim 1, wherein the gate line and the gate electrode comprise the transparent conductive film and the gate metal film.

7. The thin film transistor substrate according to claim 6, further comprising:
   a gate pad connected with the gate line, the gate pad comprising the transparent conductive film and the gate metal film in a connection area connecting the gate pad and the gate line and consisting of the transparent conductive film in a pad section; and
   a data pad connected with the data line, the data pad consisting of the transparent conductive film.

8. The thin film transistor substrate according to claim 1, further comprising a storage electrode which overlaps the gate line with the gate insulating pattern therebetween, the storage electrode connected to the pixel electrode so as to form a storage capacitor.

9. The thin film transistor substrate according to claim 1, wherein the source and drain electrodes are disposed at least as far as the semiconductor passivation film.

10. A fabricating method of a thin film transistor substrate, the method comprising:
    depositing a transparent conductive film, a gate metal film, a gate insulating film, and a semiconductor on a liquid crystal display substrate;
    patterning the gate metal film and the transparent conductive film to form a pixel electrode and a gate pattern that includes a gate line, a gate electrode, a gate pad and a data pad;
    patterning the semiconductor and the gate insulating film to form a semiconductor pattern which forms a channel and a gate insulating pattern and to expose the transparent conductive film of the gate pad, the data pad and the pixel electrode;
    forming a data pattern that includes a data line, a source electrode, and a drain electrode on the semiconductor pattern; and
    forming a semiconductor passivation film on an exposed active layer of the semiconductor pattern;
    wherein a length of the semiconductor passivation film on the exposed active layer is same with a length of the exposed active layer corresponding to the channel.

11. The fabricating method according to claim 10, wherein the pixel electrode consists of the transparent conductive film in the pixel area and the gate metal film is adjacent to and circumscribes the transparent conductive film forming the pixel electrode.

12. The fabricating method according to claim 10, wherein the semiconductor pattern and the gate insulating pattern along the gate pattern are overlapped the gate pattern.

13. The fabricating method according to claim 10, wherein patterning the semiconductor and the gate insulating film comprises:
    sequentially depositing the gate insulating film and first and second semiconductor layers on the gate pattern and the pixel electrode;
    patterning the gate insulating film and the first and second semiconductor layers to form the gate insulating pattern, the active layer and an ohmic contact layer that have the same pattern; and patterning the gate metal film using the gate insulating pattern as a mask.

14. The fabricating method according to claim 10, wherein patterning the semiconductor and the gate insulating film comprises:

sequentially depositing the gate insulating film and first and second semiconductor layers on the gate pattern and the pixel electrode;

forming a stepped photo-resist pattern on the second semiconductor layer using a partial exposure mask;

patterning the gate insulating film and the first and second semiconductor layers using the photo-resist pattern to form the gate insulating pattern, the active layer and an ohmic contact layer;

ashing the photo-resist pattern;

removing the exposed active layer and ohmic contact layer except the active layer and ohmic contact layer of a thin film transistor using the ashed photo-resist pattern;

patterning the gate metal film using the gate insulating pattern as a mask.

15. The fabricating method according to claim 10, wherein forming the semiconductor passivation film comprises combining the active layer with at least one of Oxygen and Nitrogen.

16. The fabricating method according to claim 10, wherein:
the gate pad is connected with the gate line, the gate pad comprising the transparent conductive film and the gate metal film in a connection area connecting the gate pad and the gate line and consisting of the transparent conductive film in a pad section; and
a data pad is connected with the data line, the data pad consisting of the transparent conductive film.

17. The fabricating method according to claim 10, further comprising forming a storage electrode which overlaps the gate line with the gate insulating pattern therebetween and is connected to the pixel electrode to form a storage capacitor.

18. The fabricating method according to claim 10, wherein the source and drain electrodes are disposed at least as far as the semiconductor passivation film.

* * * * *